(12) United States Patent
Fjelstad

(10) Patent No.: US 6,229,100 B1
(45) Date of Patent: May 8, 2001

(54) LOW PROFILE SOCKET FOR MICROELECTRONIC COMPONENTS AND METHOD FOR MAKING THE SAME

(75) Inventor: Joseph Fjelstad, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/234,650

(22) Filed: Jan. 21, 1999

Related U.S. Application Data

(62) Division of application No. 08/999,758, filed on Nov. 26, 1997, now Pat. No. 5,983,492.
(60) Provisional application No. 60/031,948, filed on Nov. 27, 1996.

(51) Int. Cl.[7] .............................. H01R 12/04; H05K 1/11
(52) U.S. Cl. ............................................. 174/261; 174/260
(58) Field of Search ...................................... 174/260, 261, 174/267; 361/749, 750, 751, 772, 774, 777, 773, 775

(56) References Cited

U.S. PATENT DOCUMENTS

| | | |
|---|---|---|
| 3,275,736 | 9/1966 | Hotine et al. .......................... 174/266 |
| 3,509,270 | 4/1970 | Dube et al. ........................... 174/266 |
| 3,616,532 | 11/1971 | Beck ...................................... 29/615 |
| 3,670,409 | 6/1972 | Reimer .................................. 29/853 |
| 3,797,103 | 3/1974 | Desmond et al. ..................... 29/856 |
| 3,818,415 | 6/1974 | Evans et al. ........................... 439/74 |
| 3,937,386 | 2/1976 | Hartleroad et al. ............. 228/180.21 |
| 3,998,377 | 12/1976 | Metz ............................... 228/180.21 |
| 4,000,054 | * 12/1976 | Marcantonio .................... 204/192.17 |
| 4,118,595 | * 10/1978 | Pfahnl et al. ......................... 174/256 |
| 4,121,044 | 10/1978 | Hadersbeck et al. ................ 174/254 |
| 4,283,839 | 8/1981 | Gursky ................................. 228/170 |
| 4,295,596 | 10/1981 | Doten et al. .................... 228/180.21 |

(List continued on next page.)

FOREIGN PATENT DOCUMENTS 6-85425  3/1994  (JP) .
8502751  6/1985  (WO) .

OTHER PUBLICATIONS

Multi–Chip Module Technologies and Alternatives: The Basics, Donn et al. EDS Van Nostrand Rhinehold Company 1993, Chapter 10 (patent prosecution. 487–524).
TRW Data Technologies 1994 Brochure.
Design News, Jan. 17, 1994, "Tiny Filter Quashes EMI".
Supplementary Interconnection Devices, Ginsberg et al., Multichip Modules and Related Technologies (pp. 201–229).

(List continued on next page.)

Primary Examiner—Jeffrey Gaffin
Assistant Examiner—Jeremy Norris
(74) Attorney, Agent, or Firm—Lerner, David, Littenberg, Krumholz & Mentlik, LLP

(57) ABSTRACT

A connector for microelectronic elements includes electrically conductive, elongated leads having contact portions underlying a compliant layer. The contact portion of each lead overlies a pedestal portion of the compliant layer. The pedestal portion is at least partially isolated from the remaining portion of the compliant layer by gaps in the compliant layer. The pedestals may thus deflect horizontally, compensating for relative movement between the connector and the microelectronic element. Portions of the leads spanning the gaps may be curved to facilitate deflection. The pedestals may be attached to a substrate having terminals. A terminal end of each lead is then electrically connected to the terminal in the substrate, either through a plated through-hole, or by bending downward and bonding. The pedestals may support a plurality of leads along their length. Alternatively, the pedestals may support only a single respective lead, in which case the pedestal is isolated from neighboring pedestals and may deflect in a plurality of horizontal directions.

27 Claims, 7 Drawing Sheets

U.S. PATENT DOCUMENTS

| | | | |
|---|---|---|---|
| 4,557,043 | 12/1985 | Starski | 29/741 |
| 4,597,617 | 7/1986 | Enochs | 439/66 |
| 4,655,519 | 4/1987 | Evans et al. | 439/393 |
| 4,658,332 | 4/1987 | Baker et al. | 361/751 |
| 4,695,870 | 9/1987 | Patraw | 257/700 |
| 4,696,096 | 9/1987 | Green et al. | 29/829 |
| 4,716,049 | 12/1987 | Patraw | 427/96 |
| 4,783,719 | 11/1988 | Jamison et al. | 361/751 |
| 4,818,728 | 4/1989 | Rai et al. | 438/108 |
| 4,846,704 | 7/1989 | Ikeya | 439/72 |
| 4,847,146 | 7/1989 | Yeh et al. | 428/332 |
| 4,887,760 | 12/1989 | Yoshino et al. | 228/56.3 |
| 4,893,172 | 1/1990 | Matsumoto et al. | 174/254 |
| 4,902,606 | 2/1990 | Patraw | 430/314 |
| 4,913,336 | 4/1990 | Yamazaki | 228/106 |
| 4,924,353 | 5/1990 | Patraw | 361/783 |
| 4,937,006 | 6/1990 | Bickford et al. | 228/219 |
| 4,950,173 | 8/1990 | Minemura et al. | 439/82 |
| 4,950,623 | 8/1990 | Dishon | 438/614 |
| 4,970,624 | 11/1990 | Arneson et al. | 361/749 |
| 4,975,079 | 12/1990 | Beaman et al. | 439/482 |
| 5,006,792 | 4/1991 | Malhi et al. | 324/762 |
| 5,006,917 | 4/1991 | Kang et al. | 257/762 |
| 5,025,348 * | 6/1991 | Suzuki et al. | 361/751 |
| 5,046,953 | 9/1991 | Shreeve et al. | 439/66 |
| 5,053,922 | 10/1991 | Matta et al. | 361/720 |
| 5,057,969 | 10/1991 | Ammen et al. | 361/720 |
| 5,086,337 | 2/1992 | Noro et al. | 257/726 |
| 5,115,964 | 5/1992 | Ameen et al. | 228/180.22 |
| 5,123,850 | 6/1992 | Elder et al. | 439/67 |
| 5,131,852 | 7/1992 | Grabbe et al. | 439/71 |
| 5,133,495 | 7/1992 | Angulas et al. | 228/180.1 |
| 5,152,695 | 10/1992 | Grabbe et al. | 439/71 |
| 5,154,341 | 10/1992 | Melton et al. | 228/180.22 |
| 5,173,055 | 12/1992 | Grabbe | 439/66 |
| 5,181,859 | 1/1993 | Foreman et al. | 439/225 |
| 5,196,726 | 3/1993 | Nishiguchi et al. | 257/737 |
| 5,199,879 | 4/1993 | Kohn et al. | 439/63 |
| 5,203,075 | 4/1993 | Angulas et al. | 29/830 |
| 5,207,585 | 5/1993 | Byrnes et al. | 439/66 |
| 5,228,861 | 7/1993 | Grabbe | 439/66 |
| 5,261,155 | 11/1993 | Angulas et al. | 29/830 |
| 5,261,593 | 11/1993 | Casson et al. | 228/180.22 |
| 5,281,684 | 1/1994 | Moore et al. | 427/96 |
| 5,282,565 | 2/1994 | Melton | 228/180.22 |
| 5,328,087 | 7/1994 | Nelson et al. | 228/175 |
| 5,343,366 | 8/1994 | Cipolla et al. | 361/785 |
| 5,346,118 | 9/1994 | Degani et al. | 228/180.22 |
| 5,349,495 | 9/1994 | Visel et al. | 361/774 |
| 5,349,500 | 9/1994 | Casson et al. | 361/749 |
| 5,354,205 | 10/1994 | Feigenbaum et al. | 439/67 |
| 5,452,182 * | 9/1995 | Eichelberger et al. | 361/749 |
| 5,459,287 | 10/1995 | Swamy | 174/266 |
| 5,463,191 | 10/1995 | Bell et al. | 174/263 |
| 5,587,885 | 12/1996 | Swamy | 361/777 |
| 5,854,085 * | 12/1998 | Raab et al. | 437/211 |
| 6,091,332 * | 7/2000 | Eberhardt et al. | 340/572.1 |

OTHER PUBLICATIONS

"A Tab Tape–Based Bare Chip Test and Burn–In Carrier", Nolan et al. 1994 ITAP & Flip Chip Proceedings (pp. 173–179).

"Mechanical Interconnection System for Solder Bump Dice", Hill et al., 1994 ITAP & Flip Chip Proceedings (pp. 82–86).

Electronic Buyers' News, Issue 867, Aug. 16, 1993, "Quieting Connectors Down" by David Gabel.

"MCM To Printed Wiring Board (Second Level) Connection Technology Options" Alan D. Knight, Multichip Module Technologies and Alternatives: The Basics (pp. 504–509;521–523).

IEE Transaction on Components, Packaging and Manufacturing Technology, Part A, vol. 18, No. 2. Jun. 1995, "Constriction Resistance of Microcone–Based Contacts".

"Design for Minimum Chip Joint Stress," IBM Technical Disclosure Bulletin, vol. 32, No. 7, Dec. 1989.

"Improved C4 Reliability Using Low Modulus Dielectric Layer," IBM Technical Disclosure Bulletin, vol. 32, No. 6A, Nov. 1989.

* cited by examiner

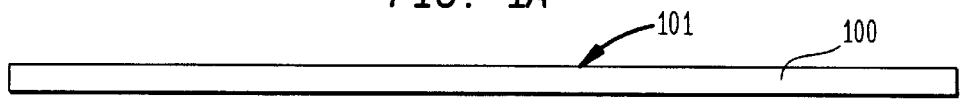
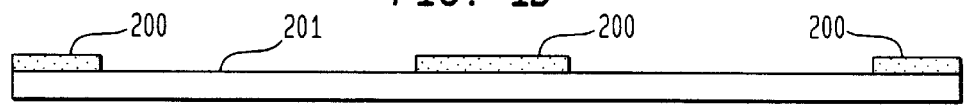
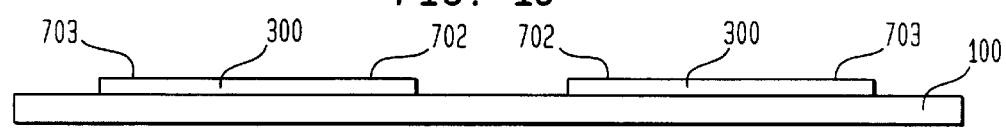
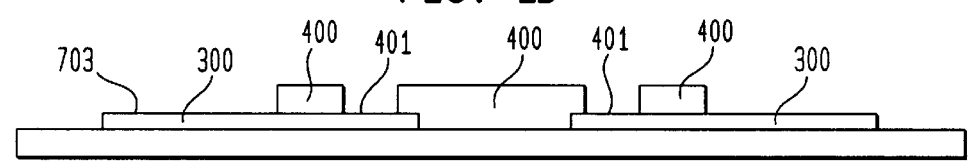
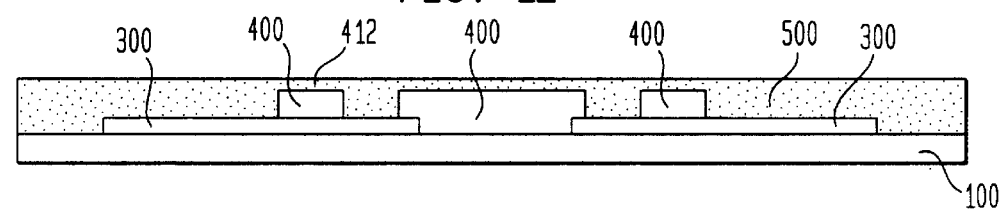
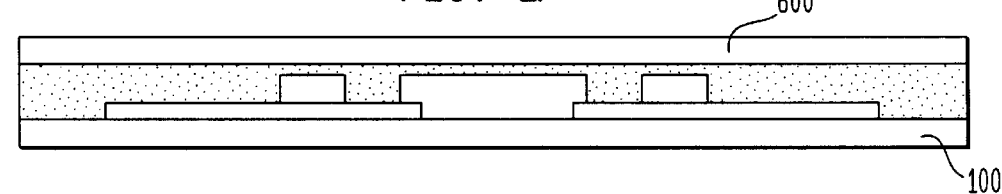
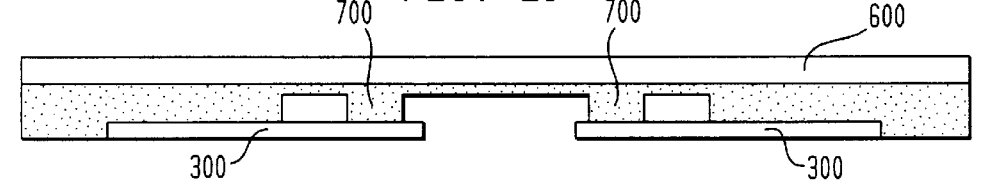
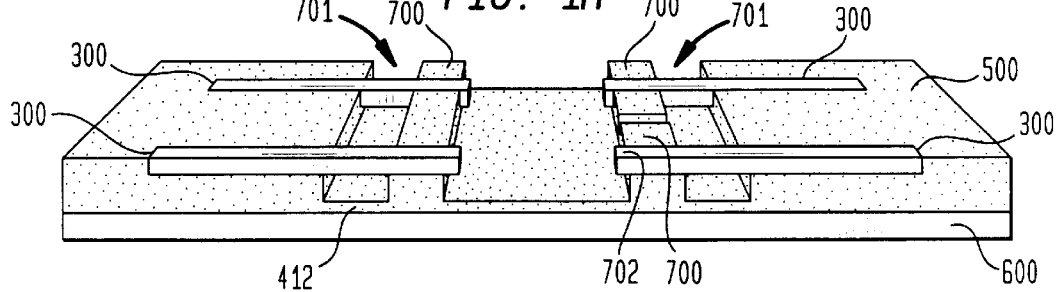

LOW PROFILE SOCKET FOR MICROELECTRONIC COMPONENTS AND METHOD FOR MAKING THE SAME

This application is a divisional application of application Ser. No. 08/999,758 filed Nov. 26, 1997 now U.S. Pat. No. 5,983,492.

The present application claims the benefit of U.S. Provisional patent application Ser. No. 60/031,948, filed Nov. 27, 1996, the disclosure of which is hereby incorporated by reference herein.

FIELD OF THE INVENTION

The present invention relates to components useful for the mounting of semiconductor chips and related electronic components, to assemblies made using such components and to methods of making such components and assemblies.

BACKGROUND OF THE INVENTION

Modern electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial numbers of I/O connections.

The size of the chip and substrate assembly is a major concern. The size of each such assembly influences the size of the overall electronic device. More compact assemblies, with smaller distances between chips provide smaller signal transmission delays and hence permit faster operation of the device.

First level interconnection structures connecting a chip to a substrate ordinarily are subject to substantial strain caused by thermal cycling as temperatures within the device change during operation. The electrical power dissipated within the chip tends to heat the chip and substrate, so that the temperatures of the chip and substrate rise each time the device is turned on and fall each time the device is turned off. As the temperatures change, the chip and substrate may expand and contract by different amounts. This causes the electrical contacts on the chip to move relative to the electrical contact pads on the substrate. This relative movement deforms the electrical interconnections between the chip and substrate and places them under mechanical stress. These stresses are applied repeatedly with repeated operation of the device, and can cause breakage of the electrical interconnections.

Further, the insertion of a chip into a socket or connector, either for testing or for permanent bonding in an application package, may cause significant stresses on the electrical interconnections and within the chip. Such stresses are created by imperfect geometries of the connection arrays, such as pitch error, by shock or impact during insertion, as well as by positioning error of the chip with respect to the connector. Those stresses are often in a horizontal plane, parallel to the facing surfaces of the chip and the connector.

Despite all of the efforts made during manufacture of the chips, some chips will be defective. These defects often cannot be detected until the chip is operated under power in a test fixture or in an actual assembly. A single bad chip can make a larger assembly including numerous chips and other valuable components worthless, or can require painstaking procedures to extricate the bad chip from the assembly. Therefore, the chips and the mounting components used in any chip assembly system should permit testing of chips and replacement of defective chips before the chips are fused to a substrate. The cost of the chip and substrate assembly is also a major concern.

All these concerns, taken together, present a formidable engineering challenge. Various attempts have been made heretofore to provide first-level interconnection structures and methods to meet these concerns. At present, the most widely utilized primary interconnection methods are wire bonding, tape automated bonding or "TAB" and flip-chip bonding.

In wire bonding, the substrate has a top surface with a plurality of electrically conductive contact pads or lands disposed in a ring-like pattern. The chip is secured to the top surface of the substrate at the center of the ring-like pattern, so that the chip is surrounded by the contact pads on the substrate. The chip is mounted in a face-up disposition, with the back surface of the chip confronting the top surface of the substrate and with the front surface of the chip facing upwardly, away from the substrate, so that electrical contacts on the front surface are exposed. Fine wires are connected between the contacts on the front face of the chip and the contact pads on the top surface of the substrate. These wires extend outwardly from the chip to the surrounding contact pads on the substrate. In wire bonded assembly, the area of the substrate occupied by the chip, the wires and the contact pads of the substrate is substantially greater than the surface area of the chip itself. Moreover, the wire bonding process does not provide any pre-testing of the chip. Thus, the bare chip must be tested using separate equipment before the wire bonding process. Testing a bare chip poses numerous practical difficulties. It is therefore difficult to make reliable low inductance electrical connections with all of the contacts on the chip simultaneously. Elder et al, U.S. Pat. No. 5,123,850 and Jameson et al, U.S. Pat. No. 4,783,719 disclose chip testing fixtures in which conductive elements on a flexible device are pressed against electrical contacts of the chip.

In the TAB process, a polymer tape is provided with thin layers of metallic material forming conductors on a first surface of the tape. These conductors are arranged generally in a fan-out pattern and extend generally radially, away from the center of the pattern. The chip is placed on the tape in a face down arrangement, with contacts on the front surface of the chip confronting the conductors on the first surface of the tape. The contacts on the chip are bonded to the conductors on the tape. Because the leads utilized in tape automated bonding extend outwardly in a radial, fan-out pattern from the chip, the assembly is much larger than the chip itself. Enochs, U.S. Pat. No. 4,597,617 and Matta et al, U.S. Pat. No. 5,053,922 disclose variants of the TAB process in which the outer ends of the leads on the tape are placed in contact with the substrate by mechanical pressure, rather than by metallurgical bonding.

In flip-chip bonding, contacts on the front surface of the chip are provided with bump leads such as balls of solder protruding from the front surface of the chip. The substrate has contact pads arranged in an array corresponding to the array of contacts on the chip. The chip, with the solder bumps, is inverted so that its front surface faces toward the top surface of the substrate, with each contact and solder bump on the chip being positioned on the appropriate contact pad of the substrate. The assembly is then heated so as to liquefy the solder and bond each contact on the chip to the confronting contact pad of the substrate. Because the flip-chip arrangement does not require leads arranged in a fan-out pattern, it provides a compact assembly. The area of the substrate occupied by the contact pads is approximately the same size as the chip itself. Moreover, in flip-chip bonding, the contacts on the chip may be arranged in a so-called "area array" covering substantially the entire front face of the chip. Flip-chip bonding therefore is well suited to use with chips having large numbers of I/O contacts. However, assemblies made by flip-chip bonding are quite susceptible to thermal stresses. The solder interconnections are relatively inflexible, and may be subjected to very high stress upon differential expansion of the chip and substrate. These difficulties are particularly pronounced with relatively large chips. Moreover, it has been difficult to test a chip having an area array of contacts before attaching the chip to the substrate.

One solution has been the use of sockets or spring-like contacts to connect the bump leads to the substrate. As microelectronic chips have decreased in size, the pitch of the solder bump interconnections has become finer, requiring a finer pitch on mating sockets. At the same time, the mating sockets must still compensate for pitch error and height error in the solder bumps on the chip. Such accommodation for solder bump location tolerances becomes increasingly more difficult as the sockets are more tightly packed in a connector.

Sockets or contacts for connecting microelectronic elements to a substrate typically add considerable height to the chip package. Because packaging space is typically at a premium in all directions, there is a need for lower profile socket or contact connectors.

U.S. Pat. No. 3,795,037 to Luttmer discloses using a large number of separate, flexible gold wires extending through a resilient medium to a connection surface, at which the gold wires terminate. The gold wires are electrically connected on the opposite side of the resilient layer to leads in a substrate. When an array of bump leads is brought into contact with the connection surface, certain of the gold wires contact each of the bump leads, and provide conductors through the resilient layer. The resilient material and the gold wires flex upon contact by the bump leads, providing compliance.

U.S. patent application Ser. No. 08/511,131, assigned to the same assignees as the present application and hereby incorporated by reference herein, in some embodiments discusses sockets having metallic projections arranged circumferentially around a hole for receiving a bump lead. The metallic projections deflect as the bump lead is urged into the hole.

U.S. Pat. No. 5,518,964 to DiStefano et al. assigned to the same assignee as the present invention, in some embodiments discusses the use of a dielectric sheet having an area array of contacts, each contact connected by a bent lead to a terminal on a microelectronic element. The dielectric sheet is spaced away from the microelectronic element, and a compliant dielectric material fills the space between the dielectric sheet and the microelectronic element. The compliance of the dielectric material, together with the compliance of the bent leads, permits the dielectric sheet, together with the contacts, to move relative to the microelectronic element.

Grabbe et al., U.S. Pat. No. 5,131,852, discloses a socket having a fan-in array with contacts for contacting terminals on a microelectronic element. The contacts and associated fan-in leads are disposed on a flexible base sheet. Each contact is supported by a spring finger beneath the base sheet, which urges the contact upward during engagement with the microelectronic element. The spring fingers are cantilevered from a peripheral support plate, and deflect into free space below the plate. No side deflection of the spring fingers is disclosed.

Yeh et al., U.S. Pat. No. 4,847,146, discloses a component mounting substrate having a continuous, low modulus expansion layer between a chip carrier and the substrate. The expansion layer absorbs stresses between the chip and the substrate in order to reduce fatigue of the solder joints. U.S. Pat. No. 4,658,332 to Baker et al. discloses a continuous, low modulus compliant layer beneath solder joints connecting a chip to a substrate. Again, the compliant layer isolates movement between the substrate and the chip due to thermal expansion, thereby reducing stress on the solder joints.

IBM Technical Disclosure Bulletin, Vol. 32, No. 7, December, 1989, discusses a resilient layer between a finger lead and a low expansion plate on which the lead is mounted. The relative thermal expansion between the low expansion plate and the chip is further compensated by choosing a lead length and material suitable for compensating for the difference in thermal expansion.

Despite all these efforts in the art, there is still a need for improved components for connecting semiconductor chips and other microelectronic elements, for improved methods of making such chips and components and for improved systems which include the connected chips and components.

SUMMARY OF THE INVENTION

The present invention addresses those needs. One aspect of the invention provides a connector for connecting a microelectronic element having an array of element terminals. As used herein, the term "element terminal" refers to terminals on a microelectronic element for connecting circuitry therein to external circuitry. Examples of element terminals include solder ball grid arrays used in flip chip bonding, and side terminals provided for flush side contact on a chip.

The connector of the present invention includes a substrate with a horizontal top surface and electrically conductive terminals. Electrically conductive, elongated leads overlie the top surface of the substrate. Each lead has first and second ends, the first ends forming an array of contacts for contacting the array of element terminals. The second ends of the leads are electrically connected to the terminals in the substrate.

Compliant pedestals support the first ends of the leads spaced away from the top surface of the substrate. The compliant pedestals have proximal ends attached to the top surface of the substrate and have distal ends that support the leads. The compliant pedestals are deflectable in at least one substantially horizontal direction in response to substantially horizontal forces exerted by the element terminals on the first ends of the leads. The pedestals are also deflectable in a vertical direction to compensate for height variations and flatness errors in the connector or in a mating ball grid array.

The compliant pedestals permit movement of the first ends of the leads in horizontal directions with respect to the substrate. As used herein, the terms "horizontal" and "vertical" mean parallel and normal to a primary surface of a substrate, respectively, or parallel and normal to facing surfaces of a microelectronic element and a connector. Such horizontal movement may result from side forces exerted during installation of the microelectronic element on the substrate, or, after bonding of the element terminals to the contacts, from differential thermal expansion between the substrate and the microelectronic element.

The compliant pedestals may be deflectable primarily in a direction parallel to the leads. In that case, the compliant pedestals may have a horizontal width in a direction parallel to the leads and a horizontal length longer than the horizontal width. The pedestals may support a plurality of leads along their length.

The compliant pedestals may be deflectable in a plurality of horizontal directions. In that case, each compliant pedestal may have horizontal width and a horizontal length substantially equal to the width, and each pedestal may support a single lead. The leads may additionally be deflectable in a vertical direction, to improve contact with the element terminals.

The first end of the lead may have an enlarged contact that is disposed on the distal end of the pedestal.

The connector may further include a support element between the second ends of the leads and the top surface of the substrate. The support element and the pedestal define a gap therebetween. The gap isolates the pedestal from the support element, permitting the pedestal to deflect in horizontal directions. In that case, the seconds ends of the leads may be electrically connected to respective terminals in the substrate by a conductive plating in a hole defined by the support element.

The second ends of the leads may alternatively be electrically connected to the terminals in the substrate through a curved second end portion of the lead, which extends downward toward the substrate terminal and is bonded thereto. The leads may have substantially vertical surfaces at their first ends for contacting side terminals on said microelectronic element.

The leads may be curved at least in a portion spanning the gap between the pedestals and the support elements. The curves allow expansion between the pedestals and support elements during deflection of the pedestals, further permitting movement of the contacts with respect to the substrate. The curves of the leads may be in a substantially horizontal plane, or a substantially vertical plane.

In another aspect of the invention, a connector for connecting the microelectronic element having an array of element terminals is provided. The connector includes a substrate having a top surface and having electrically conductive terminals, and a compliant layer having first and second major surfaces. The second major surface of the compliant layer faces the top surface of the substrate. Electrically conductive, elongated leads overlie the first surface of the compliant layer. Each lead has a first end defining the contact for contacting one of the element terminals, and a second end electrically connected to one of the substrate terminals.

The compliant layer defines at least one gap open to the first major surface. The gap at least partially isolates a contact support portion of the compliant layer from the remaining portion of the compliant layer. The contact support portion underlies the contact, and is deflectable in at least one direction parallel to the top surface of the substrate. The contact support portion may additionally be deflectable in a direction substantially normal to the top surface of the substrate.

The contact support portion of the compliant layer may be completely isolated from the remaining portion of the compliant layer by the gaps. The contact support portion may underlie only a single contact. Alternatively, the contact support portion may be elongated in a direction transverse to the leads and underlie a plurality of leads arranged along the length of the contact support portion. In that case, the gap extends beneath the plurality of leads.

The second ends of the leads may be electrically connected to respective substrate terminals by conductive plating in a hole in the compliant layer. Alternatively, the second ends of the leads may be electrically connected to the substrate terminals by a downwardly bent portion of the leads. Portions of the leads spanning the gap may be curved to provide flexibility for deflection of the contact support portion. The curve of the leads may be in a plane substantially parallel to or substantially normal to the top surface of the substrate. The first ends of the leads may terminate in substantially vertical surfaces for contacting side terminals on a microelectronic element.

In a method for making a microelectronic connector according to the invention, a sheet-like sacrificial substrate having a top surface is first provided. A plurality of elongated metallic leads are formed on the top surface of the substrate. The leads have first end portions and second end portions.

A photoresist layer is formed over the leads and over the top surface of the substrate. The photoresist layer defines first open areas over the first end portions of the leads. Compliant pedestals are then formed by filling the first open areas in the photoresist layer with a compliant material.

The sacrificial substrate is then removed together with the photoresist layer. The pedestals are left free standing, and support the first ends of the leads.

The method may further include the step of attaching a substantially rigid cap layer over the compliant pedestals and over the photoresist layer. In that case, the end result of the process yields a component having leads supported spaced away from the cap layer on the pedestals. The cap layer may be a printed circuit board.

The step of forming the plurality of elongated metallic leads on the top surface of the substrate may include forming a photoresist pattern on the top surface defining open areas on the top surface, depositing a conductive metal within the open areas, and removing the photoresist pattern, leaving the metallic leads.

In addition to the first open areas, the photoresist layer may further define second open areas over the leads, remote from the first end portions of the leads. In that case, the step of forming the compliant pedestals also includes forming lead supports by filling the second open areas with compliant material. The lead supports then support the leads, and, together with the pedestals, define gaps beneath the leads.

The method for making a microelectronic connector may further include the steps of attaching a substrate over the compliant pedestals on an end of the pedestals opposite the leads, and electrically connecting the second end portions of the leads with terminals in the substrate. The leads may be electrically connected to the terminals by forming holes in the lead supports, plating the holes with a conductive material, and connecting each of the leads to a corresponding terminal through a corresponding plated hole.

The leads may be formed to have curved portions intermediate the first and second lead portions. The step of providing a photoresist layer in that case includes defining the first and second open areas so as to include at least part of the curved portions of the leads between the open areas.

In another method of connecting the leads to the terminals in the substrate, the photoresist layer is formed such that the second end portions of the leads are outside the second open areas. This results in the second lead supports being formed so that the second ends of the leads extend beyond the lead supports. This method further includes the steps of attaching a substrate over the compliant pedestals on an end opposite the leads, and electrically connecting the leads to the terminals in the substrate by bending the leads toward the substrate and bonding the leads to the terminals.

The step of forming a plurality of leads may comprise forming curved leads by providing a first photoresist pattern on the top surface defining first open areas corresponding to curves in the- leads, and etching the substrate in the first open areas to form indentations. The first photoresist pattern is then removed, and a second photoresist pattern is provided on the top surface defining second open areas corresponding to the leads and including the curves. The leads are formed by depositing conductive metal within the open areas, with the indentation forming a curve in the deposited conductive metal. The second photoresist pattern is then removed.

These and other features and advantages of the present invention will be more readily apparent from the detailed description of the preferred embodiments set forth below, taken in conjunction with the accompanying drawings.

BRIEF DESCRIPTION OF THE DRAWINGS

FIGS. 1A–1G are diagrammatic cross-sectional views showing sequential steps in a method for making a microelectronic connector according to one embodiment of the invention;

FIG. 1H is a diagrammatic perspective view of a microelectronic connector fabricated using the process represented by FIGS. 1A–1G;

DETAILED DESCRIPTION OF THE PREFERRED EMBODIMENT

Figure 2A:
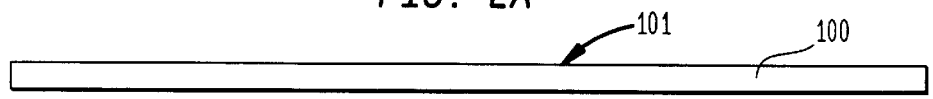
FIGS. 2A–2G are diagrammatic cross-sectional views showing sequential steps in another method for making a microelectronic connector according to one embodiment of the invention.
Figure 2B:
Figure 2C:
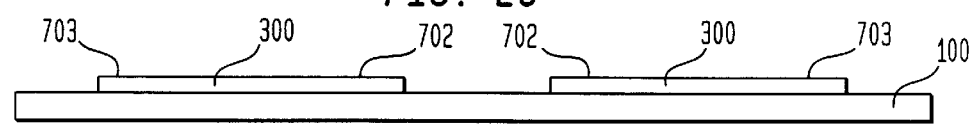
Figure 2D:
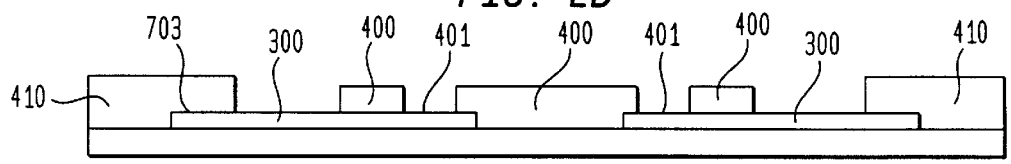
Figure 2E:
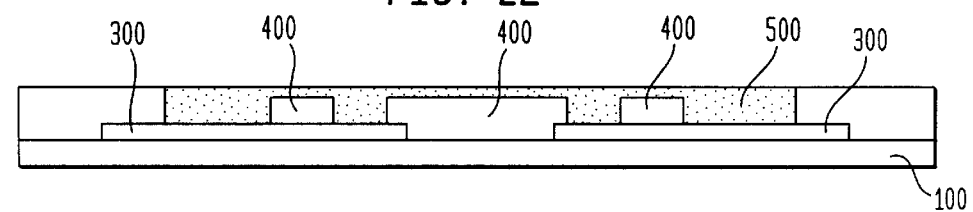
Figure 2F:
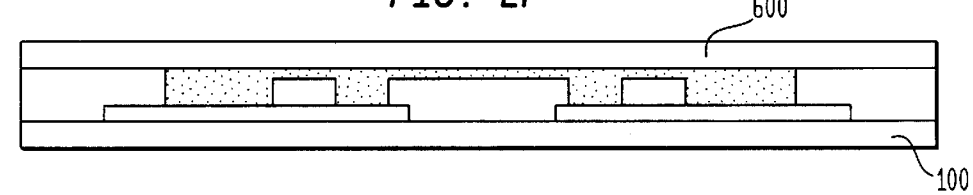
Figure 2G:
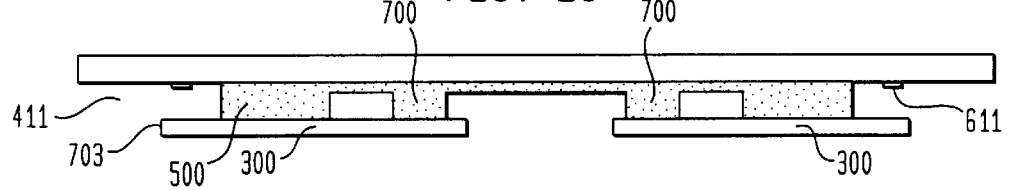
Figure 2H:
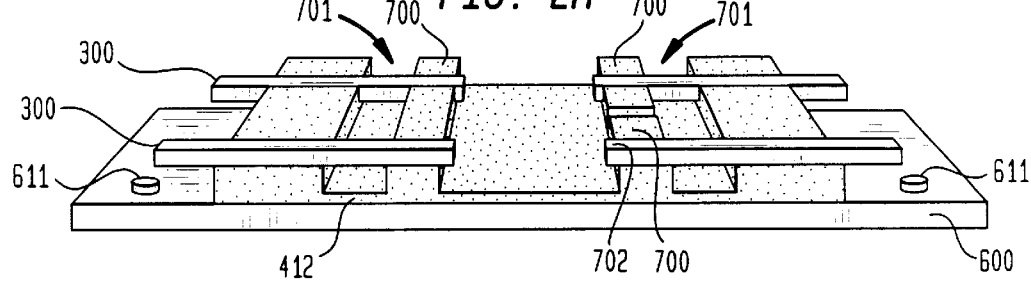
FIG. 2H is a diagrammatic perspective view of a microelectronic connector fabricated using the process represented by FIGS. 2A–2G.

The present invention provides a compliant, resilient socket for a microelectronic device. The socket is designed to compensate for lateral and vertical forces that act upon it when a semiconductor package is biased against or assembled to the socket. The socket may be used for test and/or burn-in purposes, may be used as a production socket for permanent bonding to terminals on the microelectronic element, or may be used for both testing and permanent bonding. In the latter case, the semiconductor chip and the interconnections thereto may be tested before permanent bonding of the connector to the chip. Where the connector is permanently bonded to the semiconductor chip, the connector also compensates for mismatches of coefficients of thermal expansion (CTE) when the microelectronic device is expanding or contracting during thermal cycling.

In a process for making a microelectronic connector according to one embodiment of the invention, a sacrificial, conductive base 100 is first provided, as shown in FIG. 1A. The base is typically a conductive metal, such as copper or similar material, that can be chemically removed later in the process.

A first layer of photoresist is deposited on a first surface 101 of the base 100. Through standard photolithographic techniques, the first layer of photoresist is selectively exposed and developed using a suitable energy source, such as ultraviolet light, and using a mask to polymerize the exposed, desired portions 200 of the photoresist layer. The undesired portions of the photoresist layer are then removed leaving only the desired portions 200 on the first surface 101 of the base 100, as shown in FIG. 1B.

Conductive leads are then formed by depositing a conductive metal onto the first surface 101 of the base 100 within the open areas 201 defined by the desired portions 200 of the first photoresist layer. The conductive metal is preferably deposited by electroplating. The conductive metal forms metallic leads 300, as shown in FIG. 1C. The resulting leads have first end portions 702 for contacting terminals on the microelectronic element, and second end portions 703 for connecting to terminals within the completed connector.

The conductive metal is preferably gold or a gold alloy; however, the leads may also be formed of another conductive material that will withstand those agents used to remove the base 100 later in the process. The residual photoresist 200 is subsequently chemically or otherwise stripped from the base 100 to leave the metallic leads 300.

The leads 300 and the first surface 101 of the base 100 are then coated with a second photoresist layer, and subsequently selectively exposed and developed to create open areas 401 between the remaining areas 400 of the second photoresist layer, as shown in FIG. 1D. The exposed surfaces of the remaining portions 400 of the second photoresist layer, the leads 300 and the top surface 101 of the base 100 are then coated with a layer of a compressible and/or low modulus material. The material is deposited over the assembly to create a compliant layer 500, shown in FIG. 1E. The compliant layer 500 typically comprises a curable liquid compliant thermoset or thermoplastic material that is cured after being deposited on the assembly. Examples of typical materials used in forming the compliant layer 500 are silicone, flexiblized epoxy, polyimide, various foam materials, thermoplastic, etc. In the open areas 401 between the residual portions 400 of the second photoresist layer, the compliant layer 500 surrounds the leads 300 on all sides except the side facing the top surface 101 of the base 100. The compliant layer 500 may be sufficiently thick to cover the residual portions 400 to form a web 412 of material.

A substantially rigid cap layer 600, best shown in FIG. 1F, is optionally applied to the top of the compliant layer. The cap layer may be laminated or may be chemically deposited. The cap layer 600 mechanically stiffens the overall assembly, and is therefore useful in situations where the finished socket assembly must be handled before application to a wiring board or other substrate. The cap layer 600 may be made of a material that is more rigid than the pedestal material, such as polyimide, epoxy, fiberglass etc. Further, the cap layer itself may be a single layer or a multi-layer wiring substrate having other components attached thereto.

The sacrificial conductive base 100 is then removed using a chemical etching technique, leaving the leads and compliant layer intact. The second photoresist layer is also removed in this or a subsequent etching process, leaving the configuration shown in FIG. 1G. To facilitate this step, the base should be a material that may be removed by a suitable etchant while leaving the leads 300 intact.

The removal of the base 100 and the photoresist 400 leaves compliant pedestals 700 supporting the leads 300 at their first end portions 702, as best shown in FIG. 1H. The leads 300 span gaps 701 between the pedestals 700 and a lead support region 500 of the compliant layer. The pedestals 700 are at least partially separated from the remaining portions of the compliant layer by gaps such as gaps 701. The webs 412 of compliant material may remain at the bases of the gaps.

First end portions 702 of the leads 300 form contacts embedded in tops of the pedestals 700, with upper surfaces of the first end portions exposed to mate with respective terminals or solder balls on a semiconductor chip package. The pedestals 700 absorb vertical as well as lateral forces directed on the first end portions 702 by the corresponding terminals or solder balls of the microelectronic element in the process of inserting the microelectronic element into the socket. Because the pedestals 700 are separated from the remainder of the compliant layer 500, they bend laterally in response to lateral forces on the first end portion 702. For example, the pedestals absorb contact stresses caused by shock or impact, or by repositioning of a ball grid array within the socket. The pedestals may additionally provide resilience in the vertical direction in order to compensate for uneven ball grid heights or uneven forces applied in the vertical direction during insertion of a microelectronic element into the socket.

Adjacent contacts embedded on the tops of the pedestals are interconnected by only the relatively thin web of compliant material comprising the pedestal itself. Vertical and horizontal deflection of the contacts is therefore relatively independent, permitting a single contact to be moved without substantially displacing neighboring contacts.

The substantially rigid cap layer 600 is required only if the assembly is to be handled before mounting on a substrate. The cap layer provides sufficient rigidity to handle and attach the assembly to a substrate. Further, the cap layer may provide sufficient rigidity to use the assembly for attaching to a ball grid array without previous attachment to a substrate.

The contacts of the socket of the invention are arranged to accommodate standard microelectronic element terminal pitches, such as 1 mm. The method and the connector of the invention permit the formation of contacts having finer pitches to accommodate the increasingly finer terminal pitches being produced. For example, a socket according to a preferred embodiment of the invention has a pitch of less than 0.75 mm; in a most preferred embodiment of the connector, the contacts have a pitch of less than 0.5 mm.

Figure 3A:
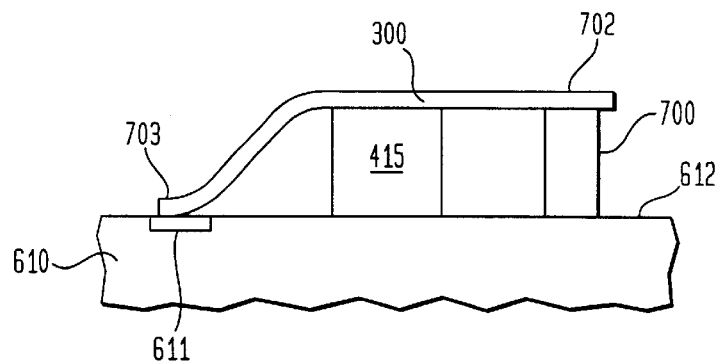
FIG. 3A is a partial diagrammatic side view of a microelectronic connector according to one embodiment of the invention.
Figure 3B:
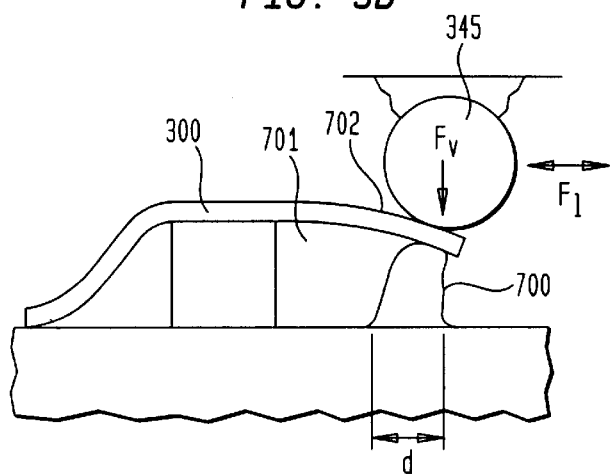
FIG. 3B is a partial diagrammatic side view of the microelectronic connector of FIG. 3A after displacement by a bump lead in vertical and horizontal directions.

The method for making a microelectronic connector may also include forming additional residual portions 410 of the second photoresist layer, as shown in the process of FIGS. 2A–2H. The additional residual portions 410 (FIG. 2D) cover the second end portions 703 of the leads 700, and may have a thickness greater than the residual portions 400. The residual portions 410 of the second photoresist layer form an open area 411 (FIG. 2G) in the compliant layer 500 around the second end portion 703 of the lead. After removing the sacrificial base layer 100 and the second photoresist layer, the second end portion 703 of the lead remains cantilevered in space over the substantially rigid cap layer 600 (FIG. 2H) or over the substrate, if the cap layer is not present. As shown in FIGS. 3A and 3B, the cantilevered terminal ends 703 of the lead may be bent downwardly and bonded to a terminal 611 in the substrate 610.

A contact of the invention, shown in FIG. 3A, includes a substrate 610 having a horizontal top surface 612, and having electrically conductive terminals such as terminal 611. Overlying the top surface 612 of the substrate 610 is a plurality of electrically conductive, elongated leads, such as lead 300. The lead 300 has a first end portion 702, and a second end portion 703. The first end portion 702 of the lead is for contacting a terminal such as a solder ball 345 (FIG. 3B) of a ball grid array. As noted above, the second end portion of the lead 300 is attached to a terminal 611 in the substrate. A compliant pedestal 700 supports the first end portion 702 of the lead 300 above the top surface 612 of the substrate 610. The pedestal 700 is deflectable in a horizontal direction generally parallel to the top surface 612, in response to a force in that direction. For example, as shown in FIG. 3B, in addition to a vertical contact force $F_V$, a lateral force 341 has been applied through the solder ball 345 to the lead 300, deflecting the pedestal 700 and the first end portion 702 of the lead. The pedestal 700 has a sufficiently small dimension d in a horizontal direction to permit the pedestal to deflect readily in such a horizontal direction. Consequently, first end portions 702 of the leads 300 may deflect independently, or at least with decreased influence from, neighboring leads. By partially or completely separating the pedestal 700 from other portions of the compliant layer, deflection within the pedestal is localized, and does not affect those portions of the compliant layer from which the pedestal is separated.

The lead 300 bridges the gap 701 between the pedestal 700 and the contact support portion 415 of the compliant layer. The metallic lead is sufficiently flexible to absorb deflection of the contact and the resulting relative movement between the first and second end portions of the lead.

In addition to its use as a socket for testing and burn-in of microelectronic elements, the connector of the present invention may also be used in situations where the component is permanently bonded to the socket. In such a production socket application, forces at the solder joint interconnects may be generated via thermal expansion of the materials adjacent to the solder joints. For example, if the adjacent materials have different coefficients of thermal expansion, shear forces develop at the solder joint interconnects during thermal cycling. Those shear forces affect the reliability of the solder joint interconnects and may lead to fatigue of those joints.

The compliant pedestal of the present invention substantially improves the reliability of the solder joint interconnection by permitting movement of the contact to compensate for the coefficient of thermal expansion mismatch between the microelectronic device and the substrate. The compliant pedestals function to absorb lateral forces in response to thermally generated forces in a manner similar to that involved in the absorption of forces generated during the positioning of the component in the socket; i.e., they absorb lateral forces directed at the socket when the microelectronic device expands and contracts during operation, thus protecting the mechanical and electrical connections therebetween.

Figure 4:
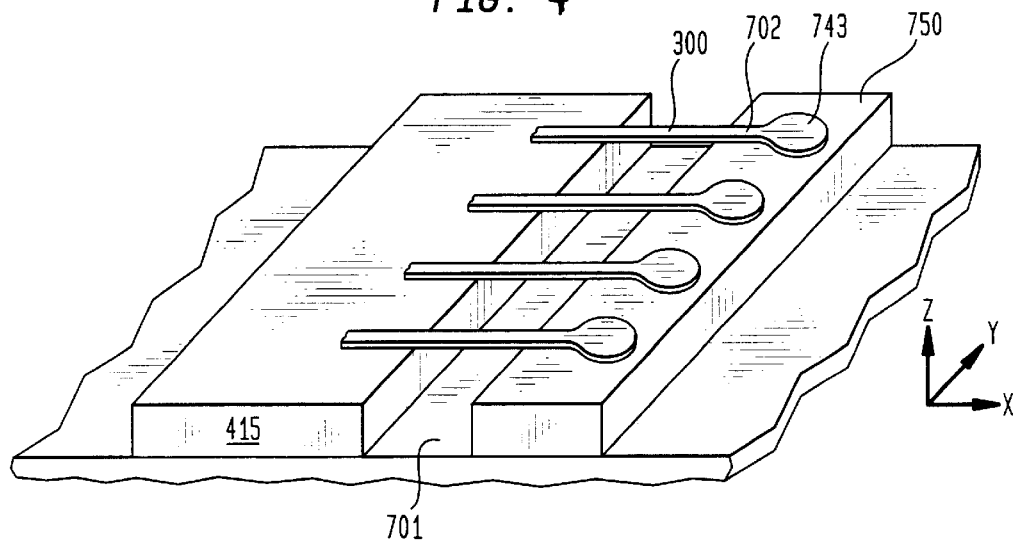
FIG. 4 is a diagrammatic perspective view depicting another embodiment of a connector according to the invention.

One embodiment of the invention is directed to the absorption of lateral forces primarily in the x direction or the direction parallel with the leads 300, as shown in FIG. 4. In that embodiment of the invention, the compliant pedestals comprise compliant strips 750 that, by virtue of a smaller dimension in the x direction, are more compliant in the x direction than in the y direction. In this embodiment, a plurality of contacts 743 formed on second end portions 702 of the leads are mounted on top of the elongated pedestal strip 750. The gap 701 between the pedestal strip 750 and the remaining portion 415 of the compliant layer permits the pedestal to move independently of the remaining portion, and permits the contacts 743 to move independently of other contacts on other pedestal strips. Furthermore, adjacent contacts 743 on a single pedestal strip 750 are permitted to move more independently with respect to each other in both the vertical and horizontal directions because of the reduced cross-sectional area of compliant material interconnecting the contacts.

The degree to which a separate contact is independently displaceable depends not only on the compliance of the underlying pedestal, but also on the stiffness and compliance of the lead connected to the contact. In one method according to the invention, shown in FIGS. 5A–5G, the lead 810 is formed with a curve in a vertical plane in order to facilitate horizontal and vertical displacement of one end of the lead with respect to the other.

Figure 5A:
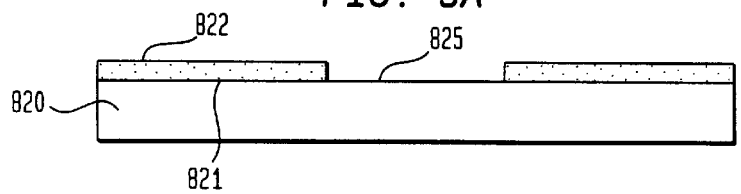
FIGS. 5A–5G are diagrammatic cross-sectional views showing sequential steps in another method for making a microelectronic connector according to one embodiment of the invention.
Figure 5B:
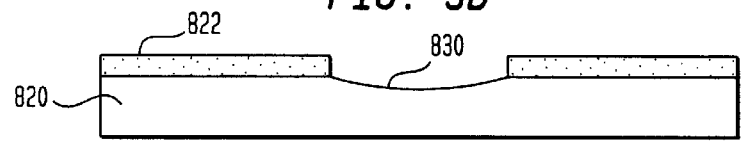
Figure 5C:
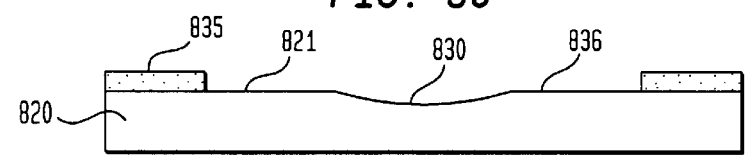
Figure 5D:
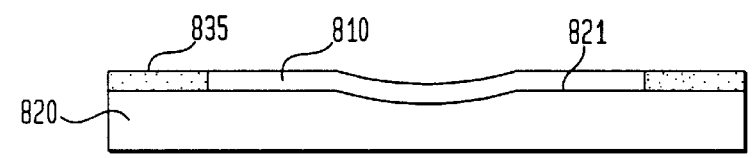

After providing a sacrificial, conductive base 820, shown in FIG. 5A, a layer of photoresist 822 is applied in a pattern on the top surface 821 of the base. The patterned photoresist 822 includes open areas 825 defining regions within which the leads will be curved. The top surface 821 of the base 820 is then exposed to an etchant, which erodes a curved indentation 830 (FIG. 5B) in the conductive base material 820. The layer of photoresist 822 is then removed, and another layer 835 of photoresist (FIG. 5C) is applied on the top surface 821 of the base. The new layer 835 of photoresist defines openings 836 wherein the leads 810 will be formed. The openings 836 include the curved indentation 830 in the base 820.

Conductive leads 810 are then formed (FIG. 5D) by depositing a conductive metal onto the surface 821 of the base 820 within the open areas 836 defined by the photoresist layer 835.

Figure 5E:
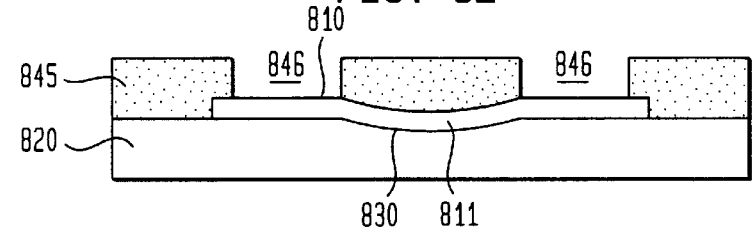
Figure 5F:
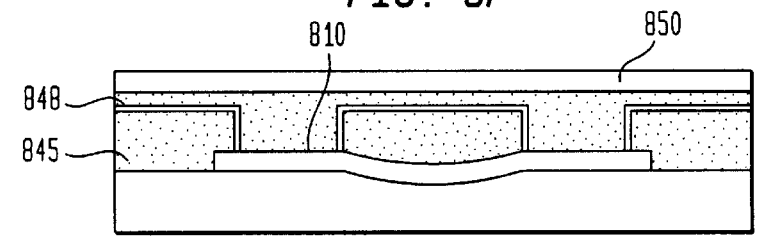
Figure 5G:
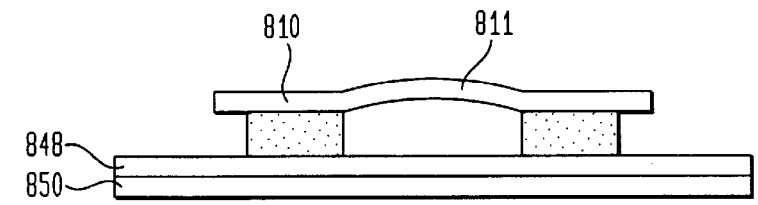

The layer of photoresist 835 is then removed and a final layer of photoresist 845 is applied. The layer of photoresist 845 defines open areas 846. The two open areas 846 include between them at least a portion of the curve 811 in the lead 810 formed by the indentation 830, as shown in FIG. 5E. A compliant layer 848 is then applied over the photoresist layer 845, filling the open areas 846 to form the pedestal and other portions of the compliant layer. A rigid cap 850 may be applied over the compliant layer. The sacrificial metallic base 820 and the photoresist layer 845 are then removed, leaving the curved lead 810 supported by the compliant layer 848 on either side of the curved portion 811 (FIG. 5G).

Figure 6:
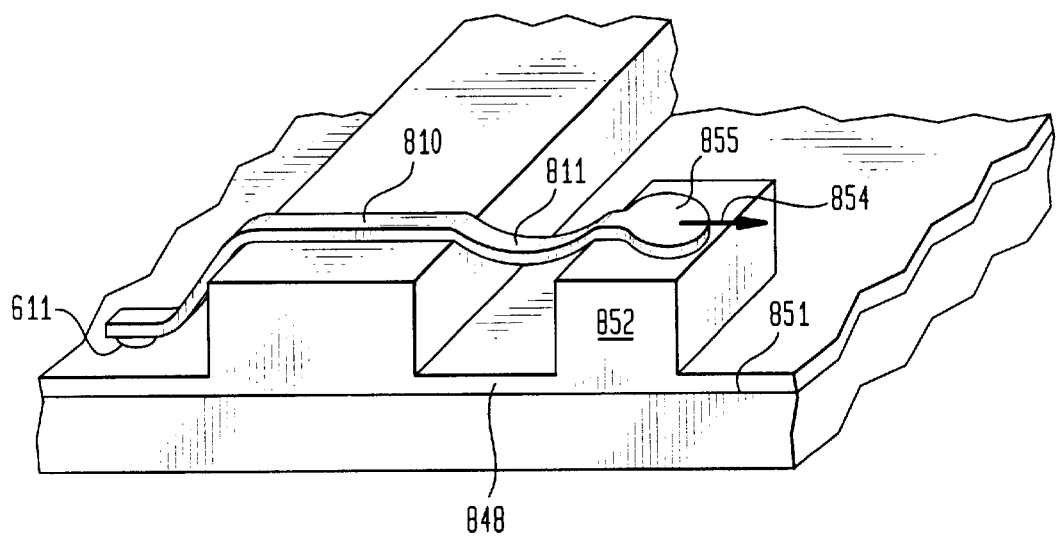
FIG. 6 is a diagrammatic perspective view depicting another embodiment of a connector according to the invention.

A lead 810 made according to the above-described process (FIG. 6) has a curved section in a vertical plane; i.e., a plane perpendicular to the primary surface 851 of the substrate. The curve 811 in the lead 810 permits the contact 853 to move in all directions relative to the remaining portions of the lead 810 without subjecting the lead to high tension loads. This is true even where the contact 853 is deflected in the direction of arrow 854 away from the terminal 611 in the substrate.

Figure 7:
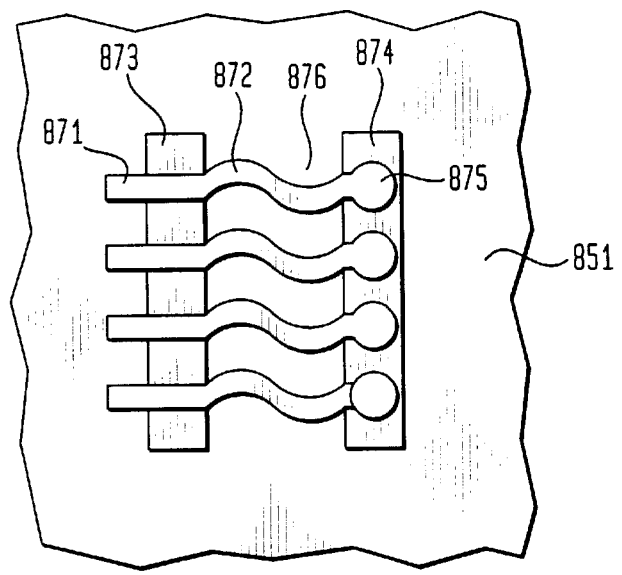
FIG. 7 is a diagrammatic plan view of a microelectronic connector according to another embodiment of the invention.

In another embodiment of the invention, the leads 871 (FIG. 7) have curves 872 in a horizontal plane; i.e., a plane substantially parallel with the top surface 851 of the substrate. The curves 872 are at least within a gap 876 between the pedestals 874 and the remaining portion 873 of the compliant layer. The horizontal curve 872, like the vertical curve 811, permits independent movement of the contact 875 with respect to the remainder of the lead 871 by providing "slack" in the lead. The horizontal curves 872 may be formed using the photolithographic lead-forming techniques described above with respect to FIGS. 1A–1H.

Figure 8:
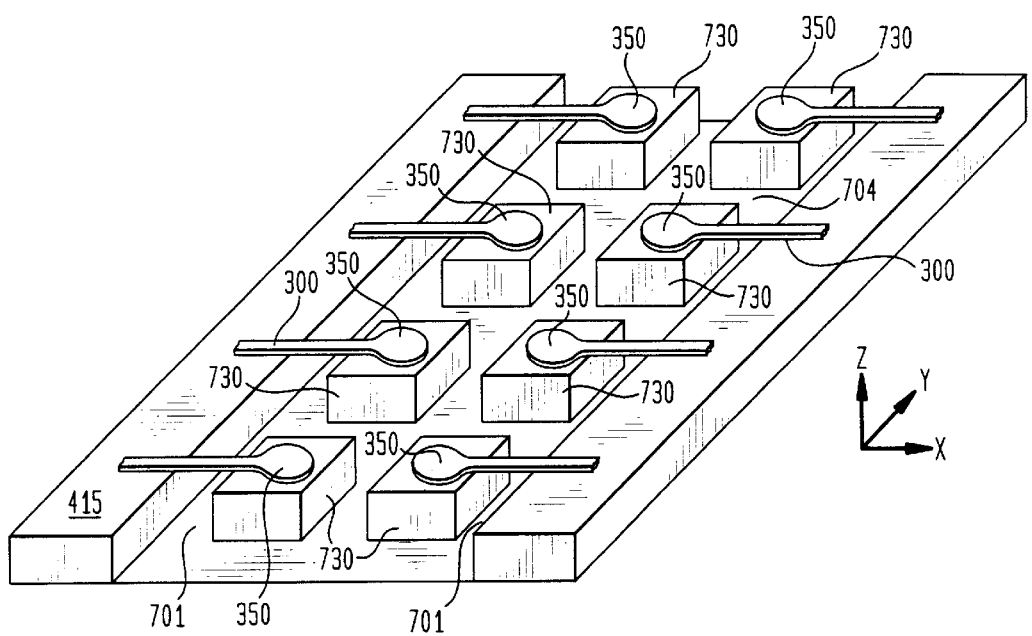
FIG. 8 is a diagrammatic perspective view of a microelectronic connector according to another embodiment of the invention.

In another embodiment of the invention, shown in FIG. 8, additional grooves 704 are formed in the compliant layer to form independent pedestals 730 underlying each of the contacts 350. Because neighboring pedestals 730 are unconnected, the contacts 350 may deflect horizontally and vertically, independent of neighboring contacts. The contacts may be arranged in a grid pattern, as shown in FIG. 8, for receiving a solder ball grid array on a microelectronic element. In this way, side forces created during assembly of a microelectronic element to the socket are absorbed by the pedestals 730, protecting the delicate interconnects between the solder ball and the semiconductor or microelectronic device package. Because of the additional resolution required to form individual pedestals of compliant material, this embodiment is especially suited for connectors having contact arrays with larger pitches, such as a connector having a 1 mm pitch.

The first end portion of the lead 300 in the embodiment shown in FIG. 8 forms an enlarged contact 350 positioned at the top of the pedestal 730. The enlarged portion 350 of the lead provides increased surface area for contacting a solder ball or other terminal on a microelectronic element.

Figure 9:
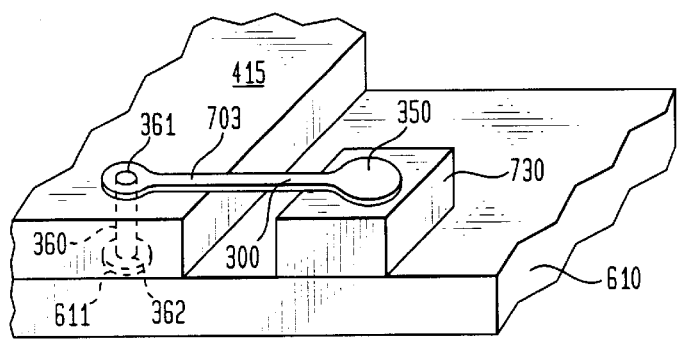
FIG. 9 is a diagrammatic perspective view of a portion of a microelectronic connector according to another embodiment of the invention.

In the embodiment of the invention shown in FIG. 9, second end portion 703 of the lead 300 is connected to a terminal 611 in the substrate 610 through a plated through-hole 360 formed in the support portion 415 of the compliant layer. The holes may be drilled in the compliant layer, or may be formed together with the pedestals 700 and gaps 701 during formation of the layer. Each plated through-hole 360 has a top end 361 coupled to the second end portion 703 of the lead 300, and a bottom end 362 coupled to a terminal 611, which, in turn, is interconnected with circuitry in the substrate 610. Thus, the contact pad 350 on top of the compliant pedestal 730 is electrically coupled with circuitry in the substrate 610.

Figure 10:
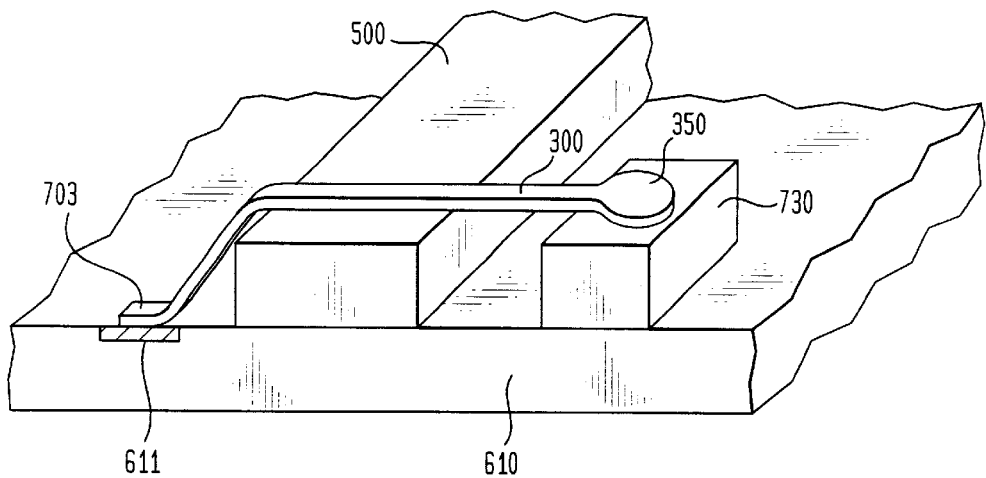
FIG. 10 is a diagrammatic perspective view of a portion of a semiconductor connector according to another embodiment of the invention.

In an alternative embodiment shown in FIG. 10, the second end portion 703 of the lead 300 is bent downward toward the substrate 610 and directly bonded to a terminal 611. A single tool such as an ultrasonic welding tool may be used to bend the lead and bond it to the terminal.

Figure 11:
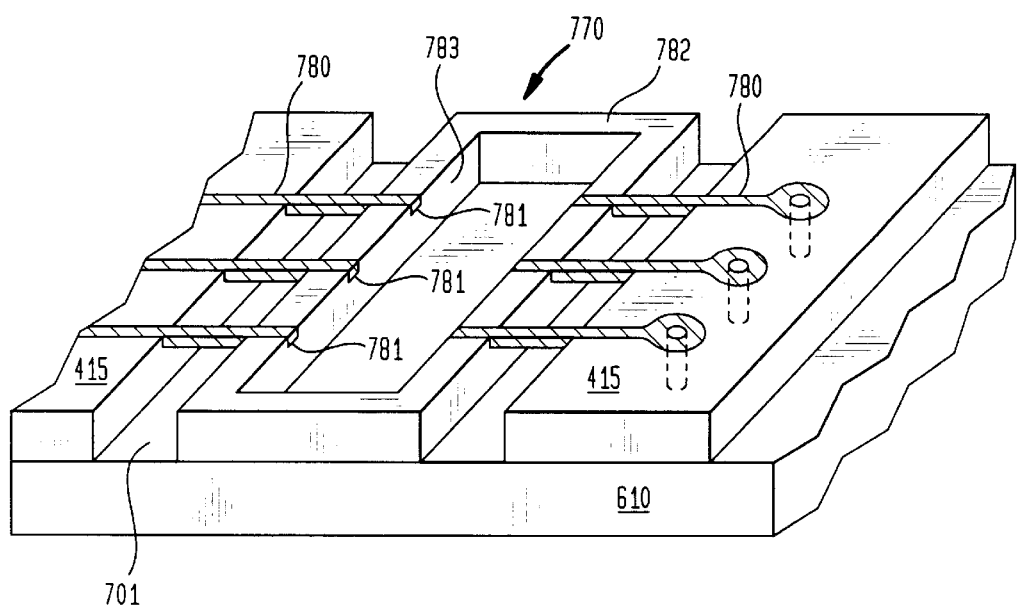
FIG. 11 is a diagrammatic perspective view of a microelectronic connector according to another embodiment of the invention.

The connector of the present invention may also be used as a side-contact socket 770, shown in FIG. 11. The side-contact socket comprises a peripheral pedestal 782 into which a microelectronic element having side contacts may be inserted.

Leads 780 extend across a gap 701 to the pedestal 782 as described above. The leads terminate in contact faces 781 that are flush with an inside wall 783 of the peripheral pedestal 782. The contact faces 781 are thus arranged for contact with a microelectronic element having side terminals.

The gap 701 separating the peripheral pedestal 782 from the lead support portion 415 of the compliant layer. The contact faces 781 of the leads 780 are thereby permitted to move both horizontally and vertically with respect to the substrate 610. Thus, the compliance of the pedestals in a horizontal direction permits the contact faces 781 to be pushed outwardly upon insertion of a microelectronic element, wiping the terminals and maintaining a force between the contacts faces 781 and the terminals on the microelectronic element. Further, because of the reduced cross section of the pedestal 782 created by the groove 701, the individual contact surfaces 781 may move, to some degree, independently of each other, absorbing individual differences in the size of the contacts on the microelectronic element.

The embodiment of FIG. 11 may further comprise additional grooves (not shown) through the pedestal 782 between individual contact faces 781, permitting further independent movement between the individual contact faces. Further, the pedestal 782 need not extend completely around a microelectronic element, but instead may comprise one or more individual sections.

The method of fabrication of the present invention may be integrated with the fabrication of a printed circuit board such that the compliant layer including the compliant pedestals forms a top layer on the printed circuit board. Such a process results in a combined assembly wherein the socket is an integral part of the printed circuit board. A large number and wide variety of sockets may thus be simultaneously fabricated onto the printed circuit board for receiving a variety of types of electronic components. Such a configuration, in combination with the use of plated through-holes, as described above, permits high density electronic component placement over the surface of the printed circuit board.

The present invention furthermore provides a very low profile socket. When fabricated integrally with a printed circuit board, the invention permits multiple printed circuit boards to be stacked close together. Thus, smaller finished system units result from the combined advantages of greater component density and lower profile. The lower profile is further advantageous in the design of components having limited height restrictions, such as designs associated with PCMCIA cards for laptop computers, where space is at a premium.

Although the invention herein has been described with reference to particular embodiments, it is to be understood that these embodiments are merely illustrative of the principles and applications of the present invention. For example, the pedestals may have shapes other than rectangular, such as round or oval. The pedestal shape may be chosen to selectively control the stiffness of the pedestal in response to forces in various horizontal directions. Furthermore, the configuration of the contact on the top surface of the pedestal may deviate from those configurations shown in the drawings. For example, the contact may have a central hole or socket, or may have asperities for improving contact with a bump lead. It is therefore to be understood that numerous modifications may be made to the illustrative embodiments and that other embodiments may be devised without departing from the spirit and scope of the present invention, as defined by the appended claims.

What is claimed is:

1. A connector for connecting a microelectronic element having an array of element terminals, comprising:
    (a) a substrate having a horizontal top surface and having electrically conductive substrate terminals;
    (b) electrically conductive, elongated leads overlying said top surface of said substrate, each said lead having first and second ends, said first ends of said leads forming an array of contacts for contacting the array of element terminals, and said second ends of said leads being electrically connected to said substrate terminals; and
    (c) compliant pedestals having proximal ends attached to said top surface of said substrate and having distal ends spaced from said proximal ends supporting said first ends of said leads overlying said top surface of said substrate, said compliant pedestals being deflectable in at least one substantially horizontal direction in response to substantially horizontal forces exerted by the element terminals on said first ends of said leads.

2. A connector as claimed in claim 1, wherein said compliant pedestals are deflectable primarily in a direction parallel to said leads.

3. A connector as claimed in claim 2, wherein each said compliant pedestal has a horizontal width in a direction parallel to said leads and a horizontal length longer than said width.

4. A connector as claimed in claim 3, wherein each said pedestal supports a plurality of said leads along its length.

5. A connector as claimed in claim 1, wherein said compliant pedestals are additionally deflectable in a vertical direction.

6. A connector as claimed in claim 1, wherein said compliant pedestals are deflectable in a plurality of horizontal directions.

7. A connector as claimed in claim 1, wherein each said compliant pedestal has a horizontal width and a horizontal length substantially equal to said width, each said pedestal supporting a single said lead.

8. A connector as claimed in claim 1, wherein said first ends of said leads comprise enlarged contacts disposed on said distal ends of said pedestals.

9. A connector as claimed in claim 1, further comprising at least one lead support element disposed between said leads and said top surface of said substrate; said at least one support element and said pedestals defining gaps therebetween.

10. A connector as claimed in claim 9, wherein said second ends of said leads are electrically connected to respective said substrate terminals by a conductive plating in holes defined by said at least one support element.

11. A connector as claimed in claim 9, wherein said second ends of said leads are curved downward toward respective substrate terminals and bonded thereto.

12. A connector as claimed in claim 9, wherein said leads are curved at least in a portion spanning said gap.

13. A connector as claimed in claim 12, wherein said leads are curved in a substantially horizontal plane.

14. A connector as claimed in claim 12, wherein said leads are curved in a substantially vertical plane.

15. A connector as claimed in claim 1, wherein said first ends of said leads terminate in substantially vertical surfaces for contacting side terminals on said microelectronic element.

16. A connector for connecting a microelectronic element having an array of element terminals, comprising:

(a) a substrate having a top surface and having electrically conductive substrate terminals;

(b) a compliant layer having first and second major surfaces, said second major surface facing said top surface of said substrate;

(c) electrically conductive, elongated leads overlying said first surface of said compliant layer, each said lead having a first end defining a contact for contacting one of the element terminals and a second end electrically connected to one of said substrate terminals;

(d) wherein said compliant layer defines at least one gap, said at least one gap at least partially isolating a contact support portion of said compliant layer from a remaining portion of said compliant layer; said contact support portion extending from said top surface of said substrate underlying said first end defining at least one said contact; said contact support portion further being deflectable in at least one direction substantially parallel to said top surface of said substrate.

17. A connector as claimed in claim 16, wherein said contact support portion is additionally deflectable in a direction substantially normal to said top surface of said substrate.

18. A connector as claimed in claim 16, wherein said contact support portion of said compliant layer is isolated from said remaining portion of said compliant layer by said at least one gap.

19. A connector as claimed in claim 18, wherein said contact support portion underlies only a single respective lead.

20. A connector as claimed in claim 18, wherein said contact support portion is elongated in a direction transverse to said leads and underlies a plurality of said leads arranged along its length.

21. A connector as claimed in claim 20, wherein said gap extends beneath said plurality of leads.

22. A connector as claimed in claim 16, wherein said second ends of said leads are electrically connected to respective said substrate terminals by a conductive plating in a hole defined by said compliant layer.

23. A connector as claimed in claim 16, wherein said second ends of said leads are electrically connected to respective said substrate terminals by a downwardly bent portion of said lead.

24. A connector as claimed in claim 16, wherein portions of said leads span said gap, said portions of said leads spanning said gap being curved.

25. A connector as claimed in claim 24, wherein said leads are curved in a plane substantially parallel to said top surface of said substrate.

26. A connector as claimed in claim 24, wherein said leads are curved in a plane substantially normal to said top surface of said substrate.

27. A connector as claimed in claim 16, wherein said first ends of said leads terminate in substantially vertical surfaces for contacting side terminals on said microelectronic element.

* * * * *